United States Patent [19]
Choi et al.

[11] Patent Number: 5,757,714
[45] Date of Patent: May 26, 1998

[54] SEMICONDUCTOR MEMORY DEVICE WITH ON-CHIP BOOSTED POWER SUPPLY VOLTAGE GENERATOR

[75] Inventors: Jong-Hyun Choi; Hong-Sun Hwang, both of Suwon, Rep. of Korea

[73] Assignee: Samsung Electronics Co., Ltd., Suwon, Rep. of Korea

[21] Appl. No.: 755,477

[22] Filed: Nov. 22, 1996

[30] Foreign Application Priority Data

Nov. 22, 1995 [KR] Rep. of Korea ............... 1995-42799

[51] Int. Cl.$^6$ .................................................. G11C 7/00
[52] U.S. Cl. ............... 365/226; 365/189.09; 365/189.11; 327/589; 257/372
[58] Field of Search .................. 365/226, 189.09, 365/189.11, 230.06, 203; 327/536, 589; 257/372

[56] References Cited

U.S. PATENT DOCUMENTS

| | | | |
|---|---|---|---|
| 5,315,188 | 5/1994 | Lee | 327/536 |
| 5,406,523 | 4/1995 | Foss et al. | 365/226 |
| 5,530,640 | 6/1996 | Hara et al. | 327/536 |
| 5,563,842 | 10/1996 | Challa | 365/189.09 |

*Primary Examiner*—David C. Nelms
*Assistant Examiner*—Huan Hoang
*Attorney, Agent, or Firm*—Marger, Johnson, McCollom & Stolowitz, PC

[57] ABSTRACT

A semiconductor memory device uses three different power supply voltage levels including an internal IVcc, ground Vss and a boosted level Vpp more positive than the internal Vcc. A precharge control circuit in the memory device includes at least one NMOS transistor, at least one PMOS transistor and an output node having voltage values ranging from the IVcc either to Vss or to Vpp. The NMOS transistor acts as a loading transistor to the PMOS transistor and prevents latch-up in the PMOS transistor by maintaining IVcc below Vpp during the initial power set-up period of the memory device.

15 Claims, 4 Drawing Sheets

1

SEMICONDUCTOR MEMORY DEVICE WITH ON-CHIP BOOSTED POWER SUPPLY VOLTAGE GENERATOR

BACKGROUND OF THE INVENTION

1. Field of the Invention

The present invention relates generally to a semiconductor memory device, and more particularly to a semiconductor memory device using an on-chip boosted power supply voltage.

2. Description of the Related Arts

In memory SRAM and DRAM devices, power supply voltages such as positive voltage Vcc and reference ground voltage Vss are required to be constant regardless of variations in the temperature and noise interference. Referring to FIG. 1, within a memory device Vcc is typically generated by an internal supply voltage generator 10. The supply voltage is referred to as internal Vcc (IVcc). IVcc has a unique DC level, for example, IVcc is 5V, 3.3V or 2.8V.

Some circuit elements in memory devices require a boosted voltage Vpp greater than the IVcc level. For instance, a word line driver must supply a boosted voltage to gates on storage cell transistors. The boosted voltage must be greater than IVcc by twice the threshold voltage. Data output buffers and isolation gates that isolate memory cell blocks from bit line sense amplifiers also require boosted supply voltages. Rather than using a charge pump capacitor, a boosting voltage generator 20 supplies a boosted supply voltage Vpp to a control circuit 30. The boosting voltage generator 20 uses less chip area, lower current and provides a higher operation speed than the charge pump capacitor.

FIG. 2 is a schematic circuit diagram for a conventional charge up/down circuit for a CMOS semiconductor memory device. A boosted voltage Vpp, IVcc and Vss are supplied to the charge up/down circuit. In a precharging mode, input signal φA goes down to the low voltage level Vss, so that PMOS (P-channel type Metal Oxide Semiconductor) transistor MP1 turns on and places voltage IVcc on node 101. When the charge up/down circuit changes to an active mode, input signal φB goes to a low Vss level. The node 101 is raised from the IVcc voltage level to the Vpp voltage level by conduction through a PMOS transistor MP2. The charge up/down circuit may be used to control the gate voltage level for an isolation transistor MN1. The gate voltage is changed from IVcc to Vpp for restoration and Vcc to Vss for isolation.

FIG. 3 is a timing diagram for various signals of the charge up/down circuit of FIG. 2. The master clock signal is divided into several phases where each phase is labeled by T followed by a number. During precharging time T1, the master clock remains at the IVcc level and the signal φA goes down to the precharging voltage level Vss. During precharging time, T1 signal φB is logically high (Vpp) and signal φC is logically low (Vss). PMOS transistor MP1 turns on, while the transistors MP2 and MN2 turn off, causing the voltage $V_N$ at node 101 to go to a high IVcc voltage level. The voltage $V_N$ is the gate voltage for NMOS transistor MN1. The voltage $V_N$ turns on MN1 coupling together nodes 102 and 103 which have voltage levels under IVcc.

When the circuit goes into an active mode at time T2, signals φA changes to Vpp and signal φB changes to Vss. Therefore, the conduction states of the transistors MP1 and MP2 are reversed from the previous precharging mode. MP1 is turned off and MP2 is turned on. The boosted voltage Vpp is supplied to the node 101 via transistor MP2. A second active mode T4 follows a second precharging mode T3. During the active node T4, the high IVcc voltage of signal φC turns on transistor MN2. In turn, the boosted Vpp level of $V_N$ is pulled down to Vss.

In the next precharging mode at time T5, signal φB remains high and signal φC goes low. This turns off the transistors MP2 and MN2. The low precharging voltage of signal φA turns on transistor MP1 returning voltage $V_N$ at node 101 to IVcc from the previous Vss ground level.

From the above description, the usefulness of the PMOS transistor MP1 is evident. Node 101 controls the transistor MN1. If node 101 is precharged to Vpp rather than to IVcc, the on-chip boosting voltage generator 10 of FIG. 1 must have a larger driving capacity, resulting in an inevitable increase in chip size. This drawback is avoided by precharging the node 101 to the IVcc voltage level through the PMOS transistor MP1 as explained above.

FIG. 4 is a cross sectional view of a semiconductor region for the transistor MP1. In this figure, like reference numerals are used for like elements of FIG. 2. The transistor MP1 is fabricated on an N-type well (also referred to as 'tub'), which is formed on the P-type silicon substrate. A gate electrode of MP1 receives the signal φA. Highly doped P-type source region ($P^+$) of MP1 is connected to the IVcc supply voltage, and the drain region of MP1 is connected to the node 101 (voltage $V_N$). The N-well is biased to the boosted voltage level Vpp.

FIG. 5 shows set-up characteristics of power supply voltages for a semiconductor memory device. In the power set-up period, the internal supply voltages IVcc and Vpp are set up to their predetermined voltage levels by receiving the external Vcc. Referring to FIG. 5, time t1 denotes the beginning of the power set-up of IVcc, and t2 is the starting point of Vpp set-up. As seen from the graph of FIG. 5, in the beginning of the power set-up period, during a period prior to time t3, the Vpp set-up starts after IVcc set-up has been initiated. This causes the IVcc level supplied to node 104 (source of the transistor MP1) to be greater than the Vpp level supplied to the well bias node of MP1. This results from the fact that the boosted voltage Vpp is generated by the boosting voltage generator 20 receiving the IVcc voltage from the internal supply voltage generator 10 as shown in FIG. 1.

As a result, during the initial power set-up period, the voltage difference between IVcc and the Vpp makes the pn junction of the source node 104 and the well bias node 105 in the transistor MP1 to be forward biased. This forward biased pn junction can cause latch-up, leading to a destruction of the transistor.

SUMMARY OF THE INVENTION

It is therefore an object of the present invention to prevent chip latch-up and to stabilize memory devices that use a boosted supply voltage in addition to the normal positive supply voltage IVcc and reference supply voltage Vss.

The present invention is used with circuits that employ, as its supply voltages, the first supply voltage IVcc, the second reference supply voltage Vss, and the third supply voltage Vpp boosted above the first supply voltage. The present invention uses at least one P-channel type MOS transistor with a substrate or well biased to the third boosted supply voltage and a source is operably connected to the first supply voltage.

A significant aspect of the present invention provides a load transistor having an input terminal coupled to the first supply voltage and an output terminal coupled to the source of the PMOS transistor. In the beginning of a power set-up period, the load transistor outputs voltage in response to an increase in the first power supply voltage IVcc that maintains a smaller value than the third power supply voltage Vpp.

The load transistor comprises a NMOS transistor having a source connected to the source of the PMOS transistor, a drain for receiving the first supply voltage IVcc, and a gate electrode receiving the third supply voltage Vpp. The NMOS transistor can be connected to multiple PMOS transistors which use the third supply voltage Vpp for substrate (or well) biasing. The drain of the PMOS transistor serves as a node for circuits such as a word line driver circuit or an isolation gate circuit that operate in a voltage range from IVcc to either Vpp or Vss. The present invention prevents latch-up in PMOS transistors caused by the boosted supply voltage during initial power set-up.

BRIEF DESCRIPTION OF THE DRAWINGS

These and other features and advantages will be more clearly understood from the detailed description taken in conjunction with the accompanying drawings.

DETAILED DESCRIPTION OF THE PRESENT INVENTION

The embodiments of the present invention will be explained in detail with reference to FIGS. 6–9.

With the present invention, a NMOS transistor MN3 includes a source electrode connected to the source of PMOS transistor MP1. The NMOS transistor prevents latch-up in transistor MP1 that can occur during the beginning of the power set-up period. The transistor MN3 acts as a loading means for supplying to the source of the transistor MP1 a voltage which is twice the threshold voltage $2V_{TN}$ below the boosted voltage Vpp and which increases in response to the increase of IVcc during the power up period.

Figure 7:
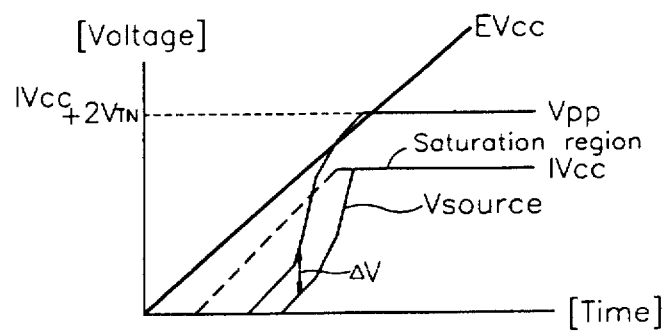
FIG. 7 is a graph showing set-up characteristics for power supply voltages used in the circuit of FIG. 6.
Figure 8:
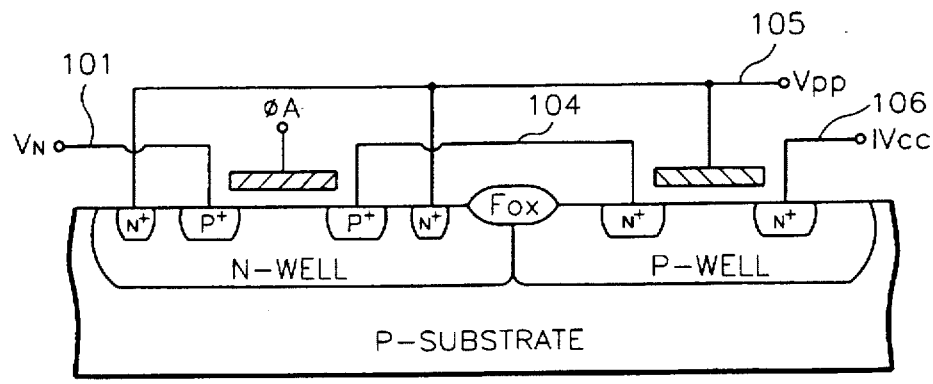
FIG. 8 is a cross sectional view of the CMOS transistor region for MP1 and MN3 of FIG. 6.

The power set-up characteristics of the voltage $V_{SOURCE}$ at the source of MP1 and of other supply voltages are shown in FIG. 7. The vertical structure of the CMOS transistor consisting of the transistors MP1 and MN3 is shown in FIG. 8. The set-up for Vpp is slightly later than the IVcc set-up, since the boosted supply voltage Vpp is generated after receiving the IVcc from the internal supply voltage generator. The boosted voltage Vpp is supplied to the gate electrode of the transistor MN3. Because of the threshold voltage drop of the transistor MN3, the voltage $V_{SOURCE}$ on node 104, associated with the source of the transistor MP1, becomes $Vpp-V_{TN}$. As a result, a reverse bias voltage is always maintained at the pn junction between the node 104 and the well bias node 105, preventing latch-up. When Vpp is fully set up to $IVcc+2V_{TN}$ (i.e., when Vpp enters into a saturation region), the threshold voltage drop of the transistor MN3 no longer exists. Thus, the source voltage $V_{SOURCE}$ at node 104 is equal the saturated IVcc level as shown in FIG. 7. When the signal φA goes low, the IVcc voltage is transferred to the node 101 through MP1.

Figure 1:
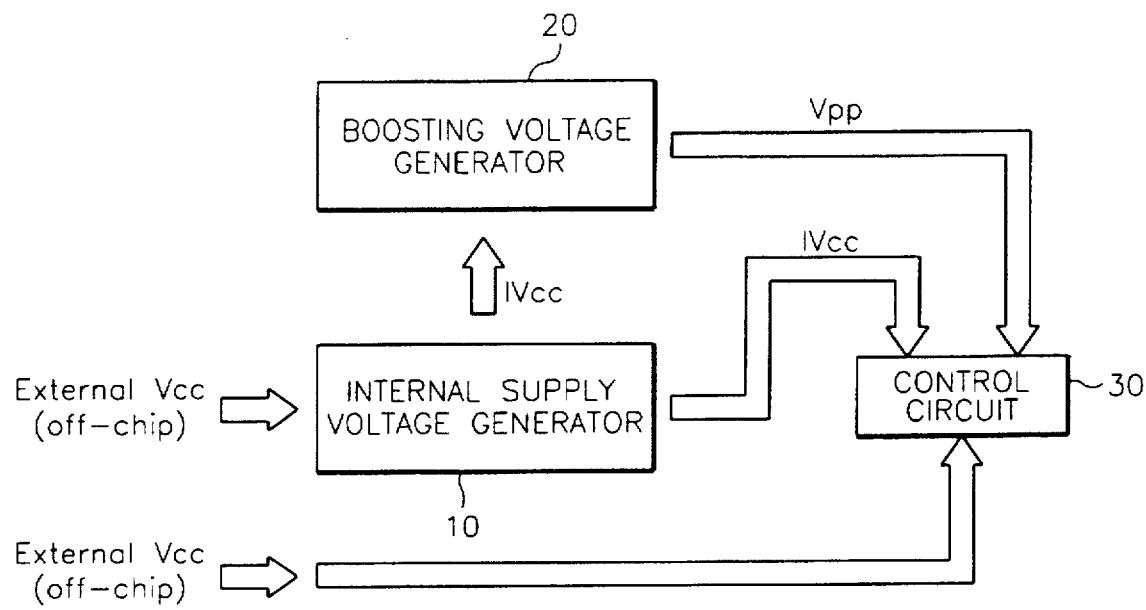
FIG. 1 is a prior art schematic block diagram of a power supply generator employed in CMOS memory devices having a boosted supply voltage.
Figure 2:
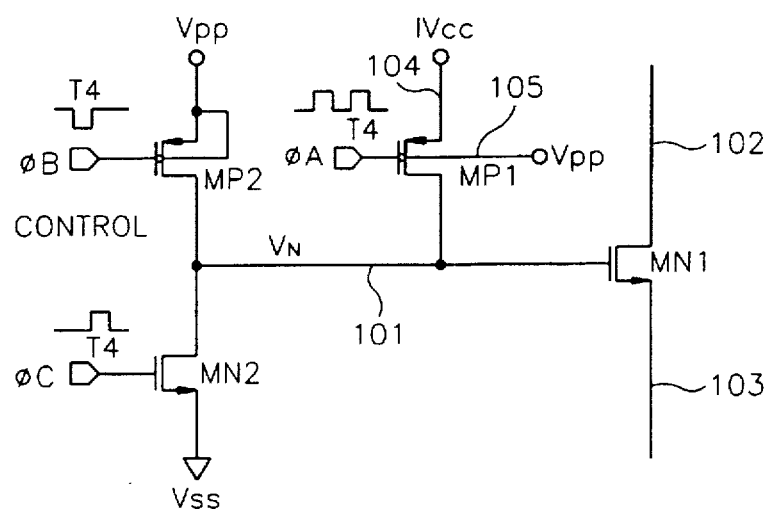
FIG. 2 is a prior art schematic circuit diagram of a conventional charge up/down circuit for a CMOS memory device.
Figure 3:
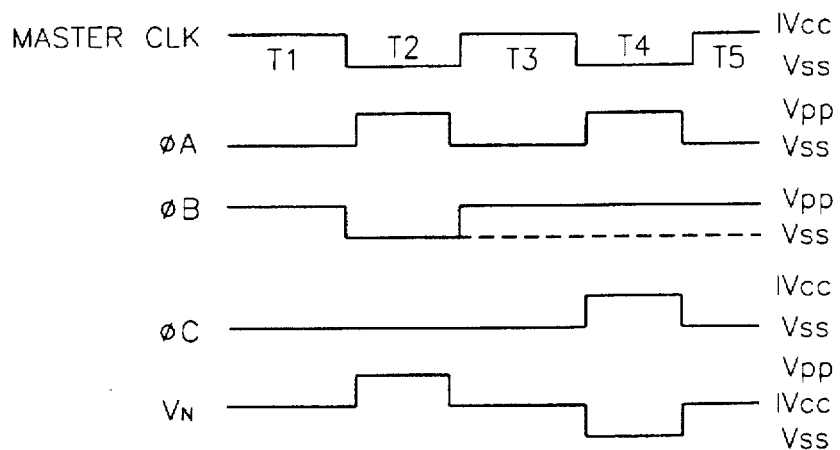
FIG. 3 is a timing diagram of various signals for a conventional charge up/down circuit of a CMOS semiconductor memory device.
Figure 4:
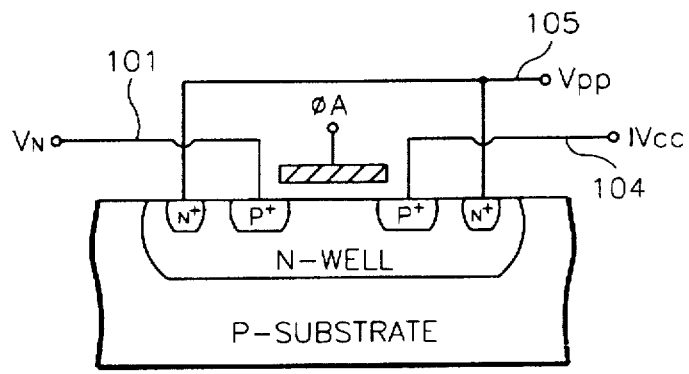
FIG. 4 is a cross sectional view of a semiconductor region for a transistor MP1 shown in FIG. 2.
Figure 5:
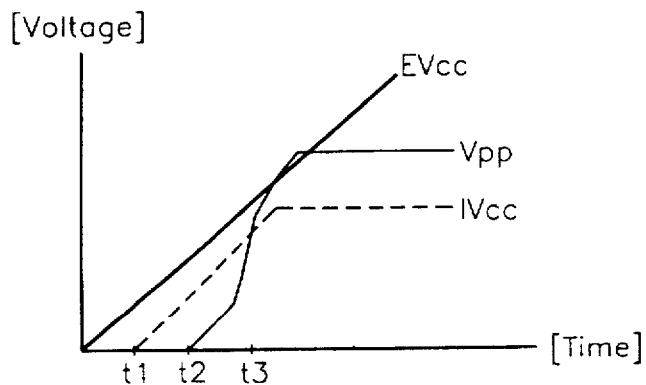
FIG. 5 is a graph showing set-up characteristics for power supply voltages in a semiconductor memory device.
Figure 6:
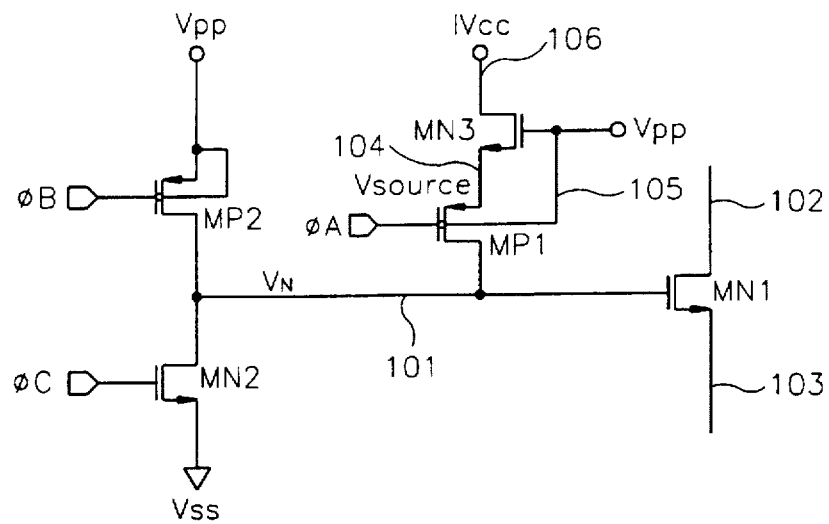
FIG. 6 is a schematic circuit diagram for a charge up/down circuit in a CMOS memory device according to the present invention.

It should be noted that though one NMOS transistor is shown connected to the source of the transistor MP1 in FIG. 6, several NMOS transistors can be serially connected to the source of MP1 and several parallel PMOS transistors can be connected to the single NMOS transistor depending on the circuit.

As explained above, the power set-up of the $V_{SOURCE}$ of MP1 is delayed from the power set-up of the boosted supply voltage Vpp. Therefore, a voltage difference ΔV greater than the threshold voltage of the NMOS transistor exists between Vpp and $V_{SOURCE}$. Accordingly, latch-up of the PMOS transistor is prevented during the initial power-up period.

Figure 9:
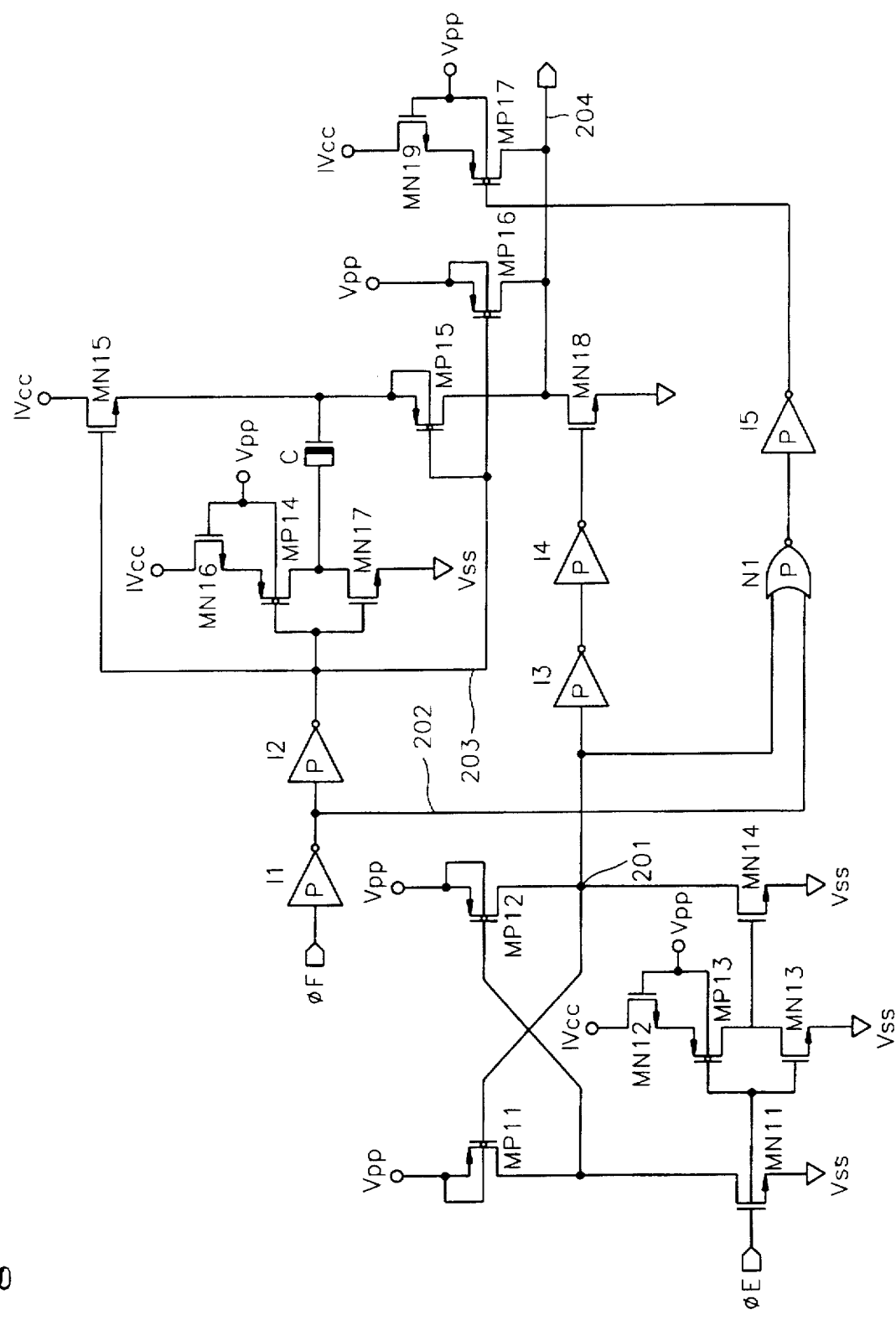
FIG. 9 is a schematic circuit diagram of an exemplary circuit in which the present invention is applied.

FIG. 9 shows an application of the present invention where a node has operation voltage values of Vss, IVcc and Vpp. Transistors MP11–MP17 are PMOS transistors, MN11–MN19 are NMOS transistors, C is a capacitor, I1–I5 are invertors, and N1 is a NOR gate. P within the symbol box represent circuit elements using the boosted voltage Vpp as a positive power supply voltage. The NMOS transistors MN12, MN16 and MN19 act as loading elements to respective PMOS transistors MP13, MP14 and MP17.

In the precharging mode, signal φE goes low and signal φF goes high. The transistors MN11 and MN13 turn off and the transistor MP13 turns on, causing the transistor MN14 to conduct and the node 201 to go low. The low voltage level at node 201 places Vss on the gate electrode of the transistor MN18 through two invertors I3 and I4, turning off MN18. The signal φF remains at a high voltage level in the precharging mode, forcing the node 202 low and the node 203 high. This causes the transistors MP15 and MP16 to turn off. The NOR gate N1 includes two inputs connected to nodes 201 and 202 which place a high voltage on the input of the inverter I5. Hence transistor MP17 is turned on. As a result, output node 204 changes to the high voltage level IVcc.

When the circuitry enters into an active operational mode, the signal φF goes low, causing the node 202 to go high and the node 203 to go low. In turn, the transistors MP15 and MP16 turn on, and the transistor MP17 turns off, causing the node 204 to change to a high Vpp voltage level. In the next precharging mode, the signal φF returns to a high voltage level. The transistors MP15 and MP16 turn off, and the transistor MP17 turns on, precharging the node 204 to IVcc.

As another active operational mode of the circuitry, both signals φE and φF go high, forcing the node 201 high and the node 202 low. The transistors MP16 and MP17 turn off. Because a high voltage is placed on the node 201, the transistor MN18 is in a conduction state causing the node 204 to go to low Vss. In the next precharging mode, φE changes to a low voltage level, causing the node 201 to go low and the transistor MN18 to turn off. Because the node 202 maintains the low voltage level, the transistor MP17 turns off by means of the NOR gate N1 and the inverter I5. Accordingly, the node 204 goes to IVcc from Vss.

As seen from the above description, the latch-up action of a PMOS transistor is prevented in circuits having an operation voltage that ranges from IVcc either to Vss or to Vpp. Latch-up is prevented by serially interconnecting at least one NMOS transistor to the source of the PMOS transistor. As a result, a voltage smaller than Vpp is applied to the source of the PMOS transistor during a precharge period.

While the present invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the present invention which fall within the true spirit and scope of this invention.

What is claimed is:

1. A semiconductor memory device having a first power supply voltage, a second reference supply voltage and a third power supply voltage greater than the first power supply voltage, said semiconductor memory device comprising:

at least one PMOS (P-channel type Metal Oxide Semiconductor) transistor, the PMOS transistor having a source operably coupled to the first power supply voltage; and a loading circuit including an input for receiving the first power supply voltage and an output providing an output signal to the source of the PMOS transistor, the output signal increasing in response to an increase of the first power supply voltage while maintaining a voltage value smaller than the third power supply voltage during a power set-up period in the semiconductor memory.

2. A semiconductor memory device according to claim 1 wherein the loading circuit comprises a NMOS transistor having a source coupled to the source of the PMOS transistor, a drain coupled to the first power supply voltage, and a gate coupled to the third power supply voltage.

3. A semiconductor memory device according to claim 2 wherein the PMOS transistor uses the third power supply voltage as a substrate bias voltage.

4. A semiconductor memory device according to claim 1 wherein the first power supply voltage is a DC voltage generated within the memory device according to an external supply voltage.

5. A semiconductor memory device according to claim 4 wherein the third power supply voltage is generated according to the first power supply voltage.

6. A semiconductor memory device according to claim 1 wherein a drain of the PMOS transistor has an operation voltage value that varies from the first power supply voltage either to the second reference supply voltage or to the third power supply voltage.

7. A semiconductor memory device comprising:

a voltage boosting circuit receiving an internal first power supply voltage and generating a second power supply voltage greater than the first power supply voltage;

a transistor coupled to the second power supply voltage; and a load circuit coupled to the transistor and including an input for receiving the first power supply voltage and an output providing an output signal, the output signal increasing in response to an increase of the first power supply voltage while maintaining a voltage value smaller than the second power supply voltage during a power-up state thereby preventing latch-up in the semiconductor memory device.

8. A semiconductor memory device according to claim 7 wherein the transistor comprises a PMOS transistor having a source terminal coupled to the output of the load circuit.

9. A semiconductor memory device according to claim 8 wherein the load circuit comprises an NMOS transistor including a gate terminal coupled to the second power supply voltage, a source terminal coupled to the source terminal of the PMOS transistor and a drain receiving the first power supply voltage, the PMOS transistor having a gate coupled to a control signal, a drain terminal coupled to a semiconductor memory control circuit, and a N-type substrate coupled to the second power supply voltage.

10. A semiconductor memory device according to claim 9 wherein the first power supply voltage is generated according to an external power supply voltage and the third power supply voltage is booted according to the first power supply voltage.

11. A method for preventing latch-up in a semiconductor memory device, comprising:

generating a first power supply voltage;

generating a boosted second power supply voltage greater than the first power supply voltage, the second power supply voltage varying in response to the first power supply voltage;

applying the first and second power supply voltage to a precharge circuit in the memory device;

generating an output voltage to the precharge circuit offset from the first power supply voltage; and increasing the output voltage in response to increases in the first power supply voltage while maintaining the output voltage at a lower voltage level than the second power supply voltage during a power set-up period in the semiconductor memory thereby preventing latch-up in the semiconductor device.

12. A method according to claim 11 wherein the second power supply voltage provides a substrate bias voltage for the precharge circuit.

13. A method according to claim 11 wherein the first power supply voltage is a DC voltage generated within the memory device according to an external supply voltage.

14. A method according to claim 11 wherein the precharge circuit supplies a voltage level to the memory device that varies from the first power supply voltage to the second supply voltage or to a third reference voltage.

15. A memory device, comprising:

a voltage boosting circuit receiving an internal first power supply and generating a second power supply voltage greater than the first power supply voltage; and a loading circuit including an input for receiving the first power supply voltage and an output providing an output signal, the output signal increasing in response to an increase of the first power supply voltage while maintaining a voltage value smaller than the second power supply voltage during a power up state thereby preventing latch up in the memory device.

* * * * *